(12) United States Patent
Wang et al.

(10) Patent No.: US 10,388,751 B2
(45) Date of Patent: Aug. 20, 2019

(54) SEMICONDUCTOR DEVICE AND METHOD FOR FORMING N-TYPE CONDUCTIVE CHANNEL IN DIAMOND USING HETEROJUNCTION

(71) Applicant: The 13th Research Institute Of China Electronics Technology Group Corporation, Shijiazhuang (CN)

(72) Inventors: Jingjing Wang, Shijiazhuang (CN); Zhihong Feng, Shijiazhuang (CN); Cui Yu, Shijiazhuang (CN); Chuangjie Zhou, Shijiazhuang (CN); Qingbin Liu, Shijiazhuang (CN); Zezhao He, Shijiazhuang (CN)

(73) Assignee: The 13$^{th}$ Research Institute of China Electronics Technology Group Corporation, Shijiazhuang (CN)

( * ) Notice: Subject to any disclaimer, the term of this patent is extended or adjusted under 35 U.S.C. 154(b) by 0 days.

(21) Appl. No.: 15/796,265

(22) Filed: Oct. 27, 2017

(65) Prior Publication Data
US 2019/0115446 A1 Apr. 18, 2019

(30) Foreign Application Priority Data
Oct. 12, 2017 (CN) .......................... 2017 1 0948671

(51) Int. Cl.
*H01L 29/267* (2006.01)
*H01L 29/66* (2006.01)
(Continued)

(52) U.S. Cl.
CPC .... *H01L 29/66431* (2013.01); *H01L 21/0254* (2013.01); *H01L 21/0262* (2013.01);
(Continued)

(58) Field of Classification Search
CPC ......... H01L 29/66431; H01L 21/02565; H01L 21/0262; H01L 21/02425; H01L 29/267;
(Continued)

(56) References Cited

U.S. PATENT DOCUMENTS

| | | | | |
|---|---|---|---|---|
| 5,099,295 A | * | 3/1992 | Ogawa ................ | H01L 29/7783 257/190 |
| 5,274,255 A | * | 12/1993 | de la Houssaye .... | H01L 21/321 257/194 |
| 5,285,087 A | * | 2/1994 | Narita ................. | H01L 29/7783 257/190 |
| 8,748,298 B2 | * | 6/2014 | Piner .................. | H01L 21/0237 438/479 |
| 9,419,121 B1 | * | 8/2016 | Teo .................... | H01L 29/41758 |

(Continued)

*Primary Examiner* — Anthony Ho
*Assistant Examiner* — Mohammad M Hoque

(57) ABSTRACT

The present application discloses a semiconductor device and a method for forming an n-type conductive channel in a diamond using a heterojunction, which pertain to the technical field of fabrication of semiconductor devices. The method comprises: forming a diamond layer on a substrate; and depositing a ternary compound having a donor characteristic and graded components on an upper surface of the diamond layer to form a first donor layer, forming a graded heterojunction at an interface between the diamond layer and the first donor layer, forming two-dimensional electron gas at one side of the diamond layer adjacent to the graded heterojunction, and using the two-dimensional electron gas as the n-type conductive channel. The method enables a concentration and a mobility of carriers in the n-type diamond channel to reach 1013 cm$^{-2}$ and 2000 cm$^2$/V·s respectively.

8 Claims, 6 Drawing Sheets

(51) Int. Cl.
  *H01L 21/02* (2006.01)
  *H01L 29/10* (2006.01)
  *H01L 21/66* (2006.01)

(52) U.S. Cl.
  CPC .. *H01L 21/02425* (2013.01); *H01L 21/02527* (2013.01); *H01L 21/02565* (2013.01); *H01L 21/02634* (2013.01); *H01L 22/14* (2013.01); *H01L 29/1054* (2013.01); *H01L 29/267* (2013.01)

(58) Field of Classification Search
  CPC ........... H01L 29/1054; H01L 21/02527; H01L 22/14; H01L 21/0254; H01L 21/02634
  USPC .......................................................... 257/77
  See application file for complete search history.

(56) References Cited

U.S. PATENT DOCUMENTS

| | | | |
|---|---|---|---|
| 2008/0099768 A1* | 5/2008 | Scarsbrook | C30B 25/20 257/77 |
| 2012/0049180 A1* | 3/2012 | Yamada | H01L 29/2003 257/43 |
| 2016/0233379 A1* | 8/2016 | Qin | H01L 29/42316 |
| 2017/0018638 A1* | 1/2017 | Teo | H01L 29/7784 |
| 2017/0069717 A1* | 3/2017 | Linthicum | H01L 29/1054 |
| 2017/0069722 A1* | 3/2017 | Linthicum | H01L 29/7783 |
| 2017/0125545 A1* | 5/2017 | Yamada | H01L 21/2258 |
| 2017/0260651 A1* | 9/2017 | Robinson | C30B 25/183 |
| 2018/0261545 A1* | 9/2018 | Sundaram | H01L 23/49822 |

* cited by examiner

SEMICONDUCTOR DEVICE AND METHOD FOR FORMING N-TYPE CONDUCTIVE CHANNEL IN DIAMOND USING HETEROJUNCTION

CROSS-REFERENCE TO RELATED APPLICATIONS

This application claims priority of China Patent Application No. 201710948671.4 filed Oct. 12, 2017.

FIELD OF THE INVENTION

The present application relates to the technical field of fabrication of semiconductor devices, and more particularly relates to a semiconductor device and a method for forming an n-type conductive channel in a diamond using a heterojunction.

BACKGROUND OF THE INVENTION

As a wide-bandgap semiconductor material, diamond possesses excellent performances, such as high breakdown field, radiation resistance, high thermal conductivity, etc. Diamond substrate device has advantages of high working temperature, great breakdown field, high cutoff frequency, large power density, etc., and would be the first choice for high power microwave devices, power electronic devices, surface acoustic wave devices, and so on in the future. The diamond has a wide bandgap and a tight atomic structure, and currently cannot be performed with effective n-type doping. An existing method for fabricating an n-type conductive channel is element doping method, which generally uses element phosphorus to perform the n-type doping, however, activation efficiency of such doping method is very low, and when a concentration of the phosphorus doping is $5 \times 10^{17}$ cm$^{-3}$, the mobility is reduced to 410 cm$^2$/V·s.

The highest electron mobility of the phosphorus doping at the room temperature disclosed by existing reports is 780 cm$^2$/V·s (room temperature), which is far from reaching a theoretical value of the diamond or playing the intrinsic excellent properties of such material. A basic physical mechanism of such doping method is as follows: impurities are ionized to release excess carriers, while under a low doping concentration, ionization of impurities is strongly inhibited, the activation rate is extremely low, and under a high doping concentration, the introduction of the doping may result in relatively strong scattering of ionized impurities, which affects the mobility of the carriers and make the mobility of the carriers almost reduced to 0. These make the doping problem of the diamond material be a worldwide problem, which may greatly restrict the development of the diamond semiconductor, since an effective p-n junction cannot be formed unless the n-type doping problem is tackled. Thus, to realize the effective and stable n-channel is a primary step for promoting the application of the diamond semiconductor material.

SUMMARY OF THE INVENTION

One of technical problems to be solved by the present application is to provide a method that enables a concentration and a mobility of carriers in an n-type diamond channel to reach $10^{13}$ cm$^{-2}$ and 2000 cm$^2$/V·s respectively.

In order to solve the above-described technical problem, the present application adopts the following technical solution: a method for forming an n-type conductive channel in a diamond using a heterojunction, comprising the following steps:

forming a diamond layer on a substrate; and
depositing a ternary compound having a donor characteristic and graded components on an upper surface of the diamond layer to form a first donor layer, forming a graded heterojunction at an interface between the diamond layer and the first donor layer, forming two-dimensional electron gas at one side of the diamond layer adjacent to the graded heterojunction, and using the two-dimensional electron gas as an n-type conductive channel.

A further technical solution is that: the method further comprises depositing a binary compound or an elementary substance having a donor characteristic on an upper surface of the first donor layer to form a second compensatory donor layer which provides compensational electrons to the first donor in the graded heterojunction.

A further technical solution is that: the method further comprises forming an epitaxial diamond layer between the first donor layer and the diamond layer.

A further technical solution is that: the ternary compound having the donor characteristic and the graded components is selected from the group consisting of $Mg_xGa_yN_z$, $Si_xB_yN_z$, $Mg_xAl_yN_z$, $Fe_xAl_yN_z$, $Mg_xGa_yO_z$, $Fe_xAl_yO_z$, $Zn_xAl_yO_z$, $Zn_xMg_yO_z$, $Mg_xGa_yF_z$, $Fe_xAl_yF_z$, $Zn_xAl_yF_z$, and $Zn_xMg_yF_z$, in each of chemical formulas representing the ternary compound, a first element, a second element, and a third element are represented from left to right, the first element is used to substitute a part of the second element to make a content of the first element gradually reduce and a content of the second element gradually increase, in the ternary compound, $x+y=a$, a represents a constant, and a value of a and a value of z respectively relate to a valence of the second element and a valence of the third element in the ternary compound.

A further technical solution is that: the element is selected from the group consisting of lithium (Li), sodium (Na), calcium (Ca), magnesium (Mg), potassium (K), silicon (Si), germanium (Ge), zinc (Zn), and iron (Fe); the binary compound is selected from the group consisting of $B_xN_y$, $Ga_xN_y$, $Al_xN_y$, $Si_xN_y$, $B_xN_y$, $Fe_xN_y$, $Ga_xO_y$, $Al_xO_y$, $Si_xO_y$, $Zn_xO_y$, and $Fe_xO_y$, in each of chemical formulas representing the binary compound, a first element and a second element are presented from left to right, a value of x and a value of y respectively relate to a valence of the first element of the binary compound and a valence of the second element of the binary compound.

The present application further discloses a semiconductor device, comprising: a substrate, a diamond layer defined on an upper surface of the substrate, a first donor layer defined on an upper surface of the diamond layer and formed by a ternary compound having a donor characteristic and graded components, a graded heterojunction formed at an interface between the diamond layer and the first donor layer, and two-dimensional electron gas formed at one side of the diamond layer adjacent to the graded heterojunction; and the two-dimensional electron gas is used as an n-type conductive channel.

A further technical solution is that: an upper surface of the first donor layer is provided with a second compensatory donor layer formed by a binary compound or an elementary substance having a donor characteristic, and the second compensatory donor layer is used to provide compensational electrons to the first donor in the graded heterojunction.

A further technical solution is that: a thickness of the first donor layer and a thickness of the second compensatory donor layer are respectively between 1 nm and 100 μm.

A further technical solution is that: the ternary compound having the donor characteristic and the graded components is selected from the group consisting of $Mg_xGa_yN_z$, $Si_xB_yN_z$, $Mg_xAl_yN_z$, $Fe_xAl_yN_z$, $Mg_xGa_yO_z$, $Fe_xAl_yO_z$, $Zn_xAl_yO_z$, $Zn_xMg_yO_z$, $Mg_xGa_yF_z$, $Fe_xAl_yF_z$, $Zn_xAl_yF_z$, and $Zn_xMg_yF_z$, in each of chemical formulas representing the ternary compound, a first element, a second element, and a third element are represented from left to right, the first element is used to substitute a part of the second element to make a content of the first element gradually reduce and a content of the second element gradually increase, in the ternary compound, x+y=a, a represents a constant, and a value of a and a value of z respectively relate to a valence of the second element and a valence of the third element in the ternary compound.

A further technical solution is that: the element is selected from the group consisting of lithium (Li), sodium (Na), calcium (Ca), magnesium (Mg), potassium (K), silicon (Si), germanium (Ge), zinc (Zn), and iron (Fe); the binary compound is selected from the group consisting of $Ga_xN_y$, $B_xN_y$, $Al_xN_y$, $Si_xN_y$, $B_xN_y$, $Fe_xN_y$, $Ga_xO_y$, $Al_xO_y$, $Si_xO_y$, $Zn_xO_y$, and $Fe_xO_y$, in each of chemical formulas representing the binary compound, a first element and a second element are presented from left to right, a value of x and a value of y respectively relate to a valence of the first element of the binary compound and a valence of the second element of the binary compound.

The above-described technical solution has the following advantageous effects: the method of the present application uses polarization between the polarity key on the surface of the diamond material and the first donor layer to produce the two-dimensional electron gas, so that carriers are separated from donor atoms and the carriers will not be affected by the scattering which otherwise may reduce the mobility thereof, meanwhile, the second compensatory donor layer is used to continuously supply compensational electrons to the components of the first donor layer, in order to realize high mobility and high concentration of the carriers in the n-type conductive channel. Compared to the conventional doping form, this doping form caused by the polarization has congenital advantages, such as relatively high mobility and stable doping efficiency, which allow the concentration and the mobility of the carriers in the n-type diamond material channel to respectively reach $10^{13}$ $cm^{-2}$ and 2000 $cm^2/V \cdot s$.

Figure 1:
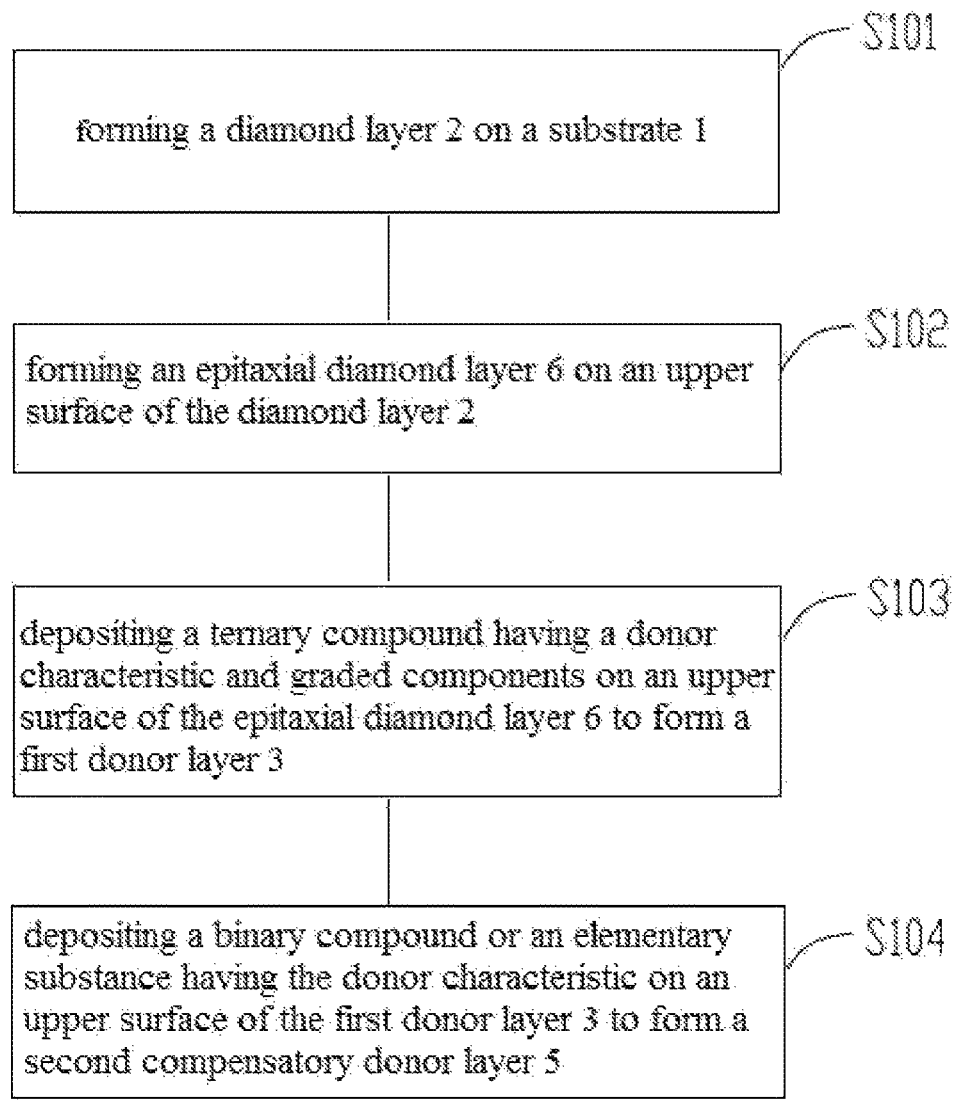
FIG. 1 is a flow chart of a method of a first embodiment of the present application.

In the drawings, the following reference numerals are used: 1. Substrate; 2. diamond layer; 3. First donor layer; 4. Two-dimensional electron gas; 5. Second compensatory donor layer; 6. Epitaxial diamond layer; 7. Interface between the diamond layer and the first donor layer.

DETAILED DESCRIPTION OF THE PREFERRED EMBODIMENTS

The drawings relating to the embodiments of the present application are combined hereinafter, so as to clearly and completely describe the technical solution of the embodiments of the present application; it is apparently that all the described embodiments are only a part of embodiments, but not all parts of embodiments, of the present application. Based on the embodiments of the present application, all other embodiments acquired by the ordinary skilled persons in the art without making any creative efforts fall within the protection scope of the present application.

Many specific details are described in the following description to make the present application fully understood, however, the present application can also adopt other modes that are different from those described herein to be carried out, the skilled persons in the art can make similar promotion without departing from the spirits of the present application, and therefore the present application is not limited to the specific embodiments as disclosed hereinafter.

Example 1

In general, as shown in FIG. 1, the present application discloses a method for forming an n-type conductive channel in a diamond using a heterojunction, and the method comprises the following steps:

S101: forming a diamond layer 2 on a substrate 1;

S102: forming an epitaxial diamond layer 6 on an upper surface of the diamond layer 2;

S103: depositing a ternary compound having a donor characteristic and graded components on an upper surface of the epitaxial diamond layer 6 to form a first donor layer 3, forming a graded heterojunction at an interface between the diamond layer and the first donor layer 3, forming two-dimensional electron gas 4 at one side of the diamond layer adjacent to the graded heterojunction, and using the two-dimensional electron gas 4 as an n-type conductive channel.

S104: depositing a binary compound or an elementary substance having the donor characteristic on an upper surface of the first donor layer 3 to form a second compensatory donor layer 5 which provides compensational electrons to the first donor 3 in the graded heterojunction.

Figure 2:
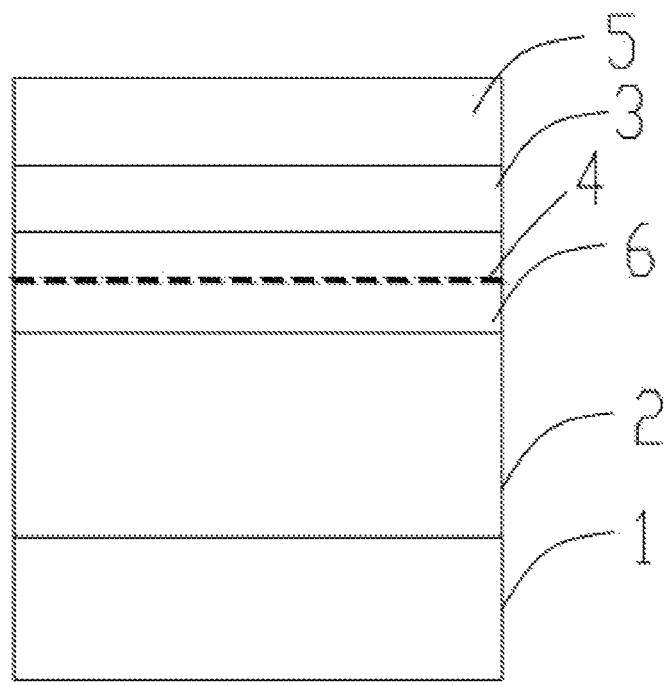
FIG. 2 is a structural schematic view of a semiconductor device of the first embodiment of the present application.

A semiconductor device is fabricated by using the above-described method, as shown in FIG. 2, the semiconductor comprises the substrate 1, the diamond layer 2 is defined on the upper surface of the substrate 1, the epitaxial diamond layer 6 is defined on the upper surface of the diamond layer, the first donor layer 3 that is formed by the ternary compound having the donor characteristic and graded components is defined on the upper surface of the epitaxial diamond layer 6, the graded heterojunction is formed at the interface between the diamond layer and the first donor layer 3, the two-dimensional electron gas 4 is formed at one side of the diamond layer adjacent to the graded heterojunction, and the two-dimensional electron gas 4 is used as a p-type conductive channel. The upper surface of the first donor layer 3 is provided with the second compensatory layer 5 formed by a binary compound or an elementary substance having the donor characteristic, and the second compensatory layer 5 is used to provide compensational electrons to the first donor layer 3 in the graded heterojunction.

Preferably, the diamond layer 2 can be acquired by any of the methods in the prior art. Preferably, the first donor layer 3 can be any ternary compounds of nitrides, oxides, and fluorides, such as $Mg_xGa_yN_z$, $Si_xB_yN_z$, $Mg_xAl_yN_z$, $Fe_xAl_yN_z$, $Mg_xGa_yO_z$, $Fe_xAl_yO_z$, $Zn_xAl_yO_z$, $Zn_xMg_yO_z$, $Mg_xGa_yF_z$, $Fe_x$-$Al_yF_z$, $Zn_xAl_yF_z$, $Zn_xMg_yF_z$, etc., which are able to produce a donor characteristic when contacting with the diamond. In each of chemical formulas representing the ternary compound, a first element, a second element, and a third element are represented from left to right, the first element is used to substitute a part of the second element to make a content of the first element gradually reduce and a content of the second element gradually increase, in the ternary compound, x+y=a, a represents a constant, and a value of a and a value of z respectively relate to a valence of the second element and a valence of the third element in the ternary compound.

Preferably, in the second compensatory donor layer 5, the element can be any elements, such as, lithium (Li), sodium (Na), calcium (Ca), magnesium (Mg), potassium (K), silicon (Si), germanium (Ge), zinc (Zn), iron (Fe), etc., that are able to produce a donor characteristic when contacting with the diamond; and the binary compound can be nitrides, such as, $B_xN_y$, $Ga_xN_y$, $Al_xN_y$, $Si_xN_y$, $B_xN_y$, $Fe_xN_y$, etc., oxides, such as, $Ga_xO_y$, $Al_xO_y$, $Si_xO_y$, $Zn_xO_y$, $Fe_xO_y$, etc., or fluorides, such as $Zn_xF_y$, $Ga_xF_y$, $Al_xF_y$, $Si_xF_y$, $B_xF_y$, etc. In each of chemical formulas representing the binary compound, a first element and a second element are presented from left to right, a value of x and a value of y respectively relate to a valence of the first element of the binary compound and a valence of the second element of the binary compound. Preferably, a thickness of the first donor layer 3 and a thickness of the second compensatory donor layer 5 are respectively between 1 nm and 100 μm. It should be noted that a ratio of the first donor layer to the second compensatory layer is not limited to the above-described specific value.

Figure 7:
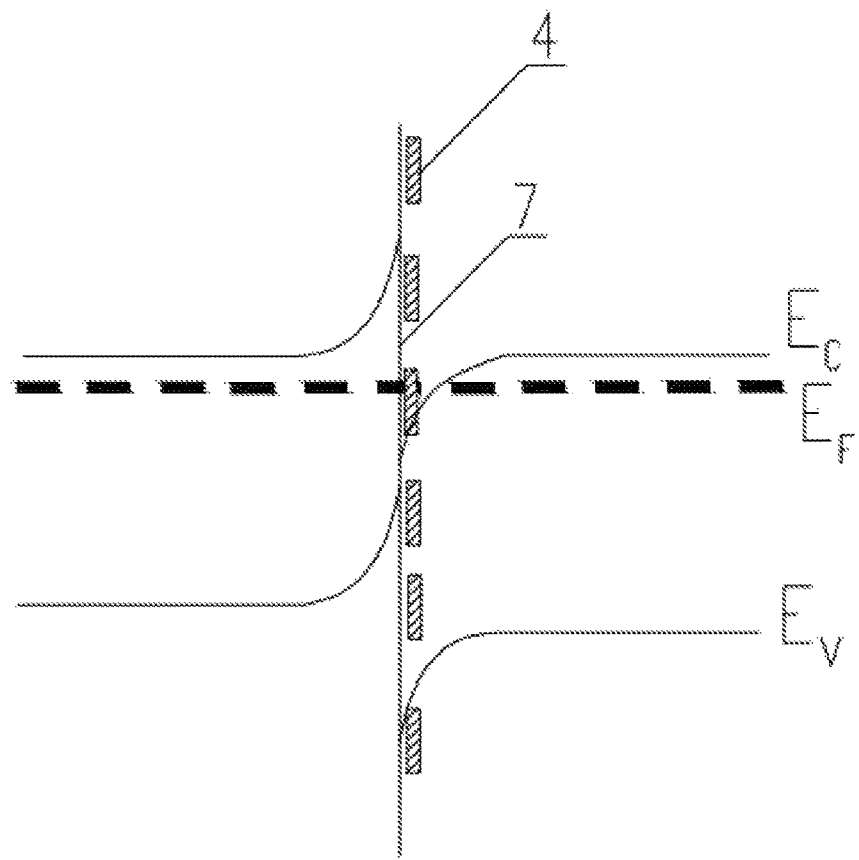
FIG. 7 is a principle diagram illustrating energy bands of the semiconductor device of embodiments of the present application.

The method of the present application uses polarization between the polarity key on the surface of the diamond material and the first donor layer to produce the two-dimensional electron gas, so that carriers are separated from donor atoms and the carriers will not be affected by the scattering which otherwise may reduce the mobility thereof, meanwhile, the second compensatory donor layer is used to continuously supply compensational electrons to the components of the first donor layer, in order to realize high mobility and high concentration of the carriers in the n-type conductive channel. Compared to the conventional doping form, this doping form caused by the polarization has congenital advantages, such as relatively high mobility and stable doping efficiency, which allow the concentration and the mobility of the carriers in the n-type diamond material channel to respectively reach $10^{13}$ cm$^{-2}$ and 2000 cm$^2$/V·s. FIG. 7 is a schematic diagram illustrating energy bands of the semiconductor device of the embodiments of the present application. A left side of the interface of FIG. 7 represents a first donor layer, and a right side of the interface represents the diamond, $E_C$ represents a bottom of a conduction band, $E_F$ represents a Fermi level, and $E_V$ represents a valence band maximum.

Example 2

Figure 3:
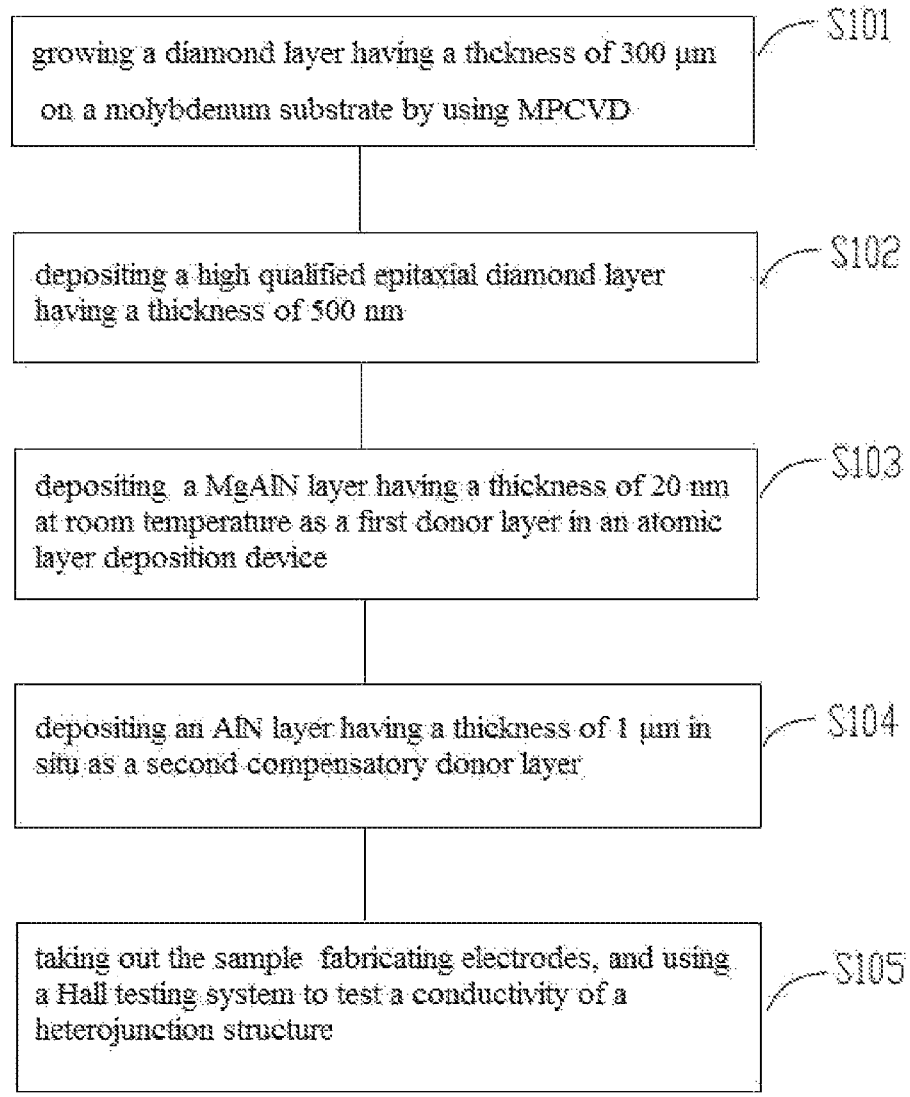
FIG. 3 is a flow chart of a method of a second embodiment of the present application.

As shown in FIG. 3, the present application discloses a method for forming an n-type conductive channel in a diamond using a heterojunction. The method comprised the following steps:

S101: a diamond layer 2 was grown on a molybdenum substrate by using microwave plasma enhanced chemical vapor deposition (MPCVD), and a thickness of the diamond layer 2 was 300 μm;

S102: a sample after being treated by S101 was placed in an MPCVD device, the MPCVD device was evacuated to reach a pressure of $10^{-8}$ mbar, thereafter, mixed gas of $CH_4$ and $H_2$ was introduced, in which, a flow rate of $CH_4$ was 1000 mL/min and a flow rate of $H_2$ was 20 L/min, a pressure of a reaction chamber was 100 mbar, a growing time was 5 hrs, and a high qualified epitaxial diamond layer 6 having a thickness of 500 nm was deposited.

S103: the sample was transferred to an atomic layer deposition device, a MgAlN layer having a thickness of 20 nm was deposited at room temperature as a first donor layer 3, and a diamond-MgAlN heterojunction was formed.

S104: an AlN layer having a thickness of 1 μm was deposited in situ as a second compensatory donor layer 5, which provided compensational electrons to the diamond-MgAlN heterojunction.

S105: the sample was taken out to fabricate electrodes, a Hall testing system was adopted to test a conductivity of the heterojunction structure, the sample was the n-type, and a mobility of carriers was 1500 cm$^2$/V·s.

Figure 4:
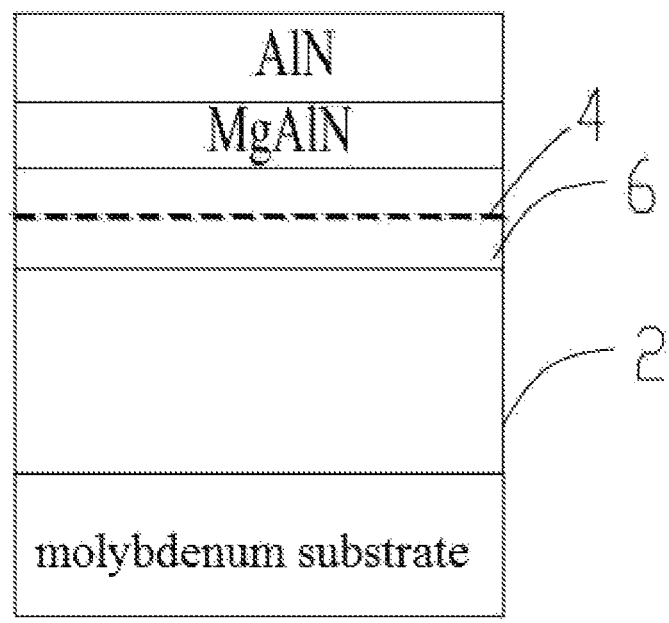
FIG. 4 is a structural schematic view of a semiconductor device of the second embodiment of the present application.

As shown in FIG. 4, the present application discloses a semiconductor device, comprises a molybdenum substrate 1, a diamond layer 2 is defined on an upper surface of the molybdenum substrate 1, an epitaxial diamond layer 6 is defined on the upper surface of the diamond layer 2, the MgAlN layer is defined on the upper surface of the epitaxial diamond layer 6 as the first donor layer 3, the AlN layer is defined on the upper surface of the MgAlN layer as the second compensatory donor layer 5.

Example 3

Figure 5:
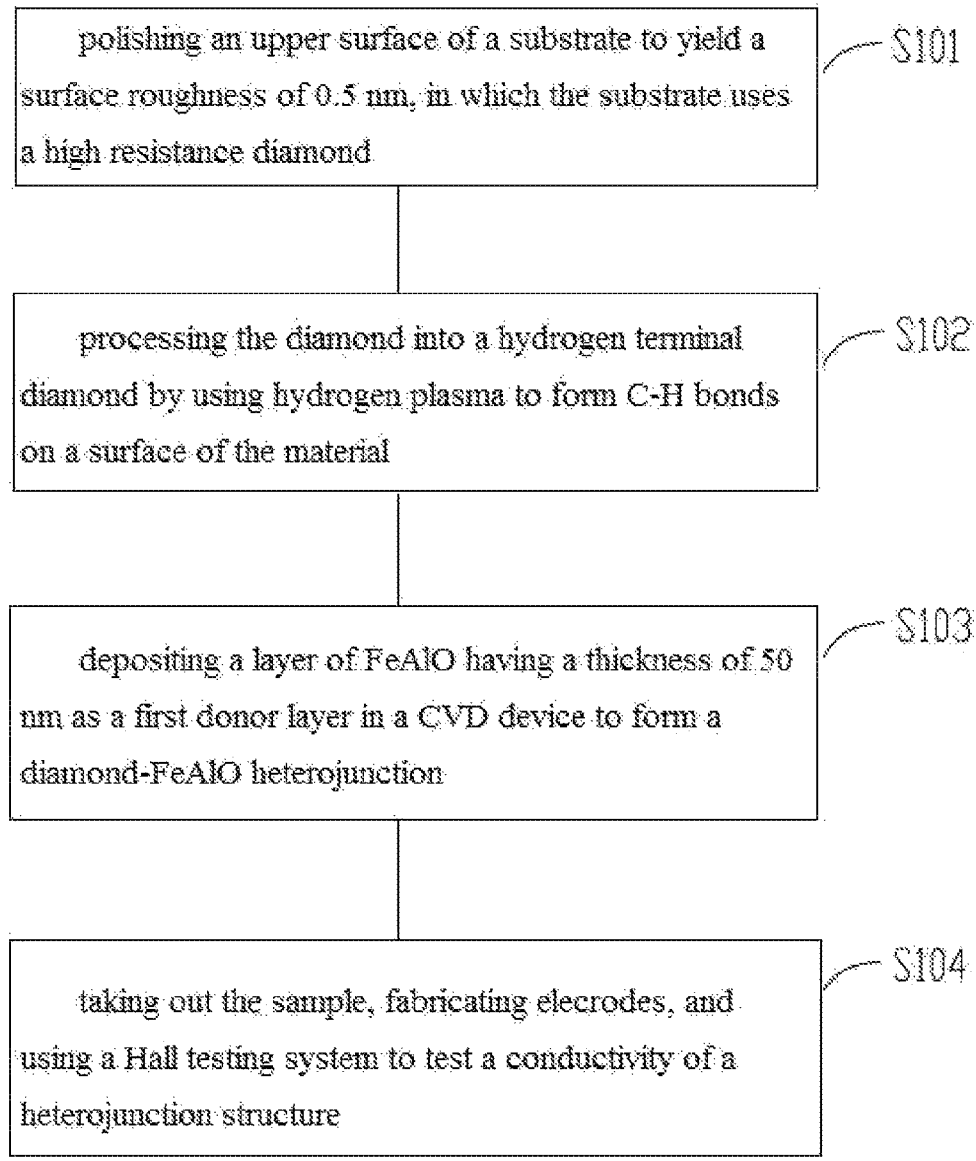
FIG. 5 is a flow chart of a method of a third embodiment of the present application.

As shown in FIG. 5, the present application discloses a method for forming an n-type conductive channel in a diamond using a heterojunction, the method comprised the following steps:

S201: an upper surface of a substrate was performed with polish treatment to make a surface roughness be 0.5 nm, and the substrate used a diamond;

S202: the diamond acquired from the treatment of S201 was placed in an MPCVD device, the diamond was processed into a hydrogen terminal diamond by using hydrogen plasma to form C—H bonds on a surface of the material;

S203: after being taken out from the MPCVD device, the sample was placed into a chemical vapor deposition (CVD) device, a layer of FeAlO having a thickness of 50 nm was deposited as a first donor layer 3 at a temperature of 600° C., and a diamond-FeAlO heterojunction was formed.

S204: after being taken out from the CVD device, the sample was processed to form electrodes, a Hall testing system was used to test the conductivity of the heterojunction structure, the sample was the n-type, and a mobility of the carriers was 2000 cm$^2$/V·s.

Figure 6:
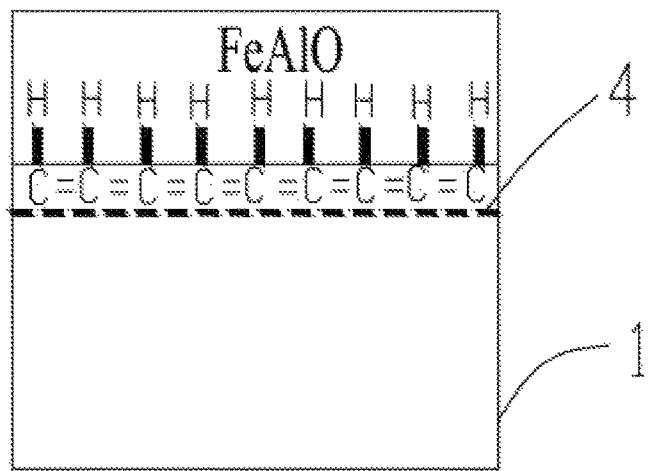
FIG. 6 is a structural schematic view of a semiconductor device of the third embodiment of the present application.

As shown in FIG. 6, the present application discloses a semiconductor device comprising a diamond substrate 1, C—H bonds are formed on an upper surface of the diamond substrate 1, and the upper surface of the substrate 1 was provided with FeAlO as the first donor layer 3.

The method of the present application adopts the first donor layer with graded barriers and the diamond surface to form the heterojunction, and uses interactions between the lattice distortion and the polar molecules to form conduction band offset mutation at the interface, electrons are excited from the donor layer with the graded barrier, a great quantity of free electrons in the quasi-two-dimensional distribution present at the side of the diamond of the heterojunction interface, forming the two-dimensional electron gas. The two-dimensional electron gas is confined in a thin layer at the interface and is separated from scattering centers of ionized impurities in physical position, thereby being capable of acquiring high mobility.

What is claimed is:

1. A semiconductor device, comprising: a substrate, a diamond layer defined on an upper surface of the substrate, a first donor layer defined on an upper surface of the diamond layer and formed by a ternary compound having a donor characteristic and graded components, a graded heterojunction formed at an interface between the diamond layer and the first donor layer, and two-dimensional electron gas formed at one side of the diamond layer adjacent to the graded heterojunction; wherein, the two-dimensional electron gas is used as an n-type conductive channel.

2. The device of claim 1, wherein an upper surface of the first donor layer is provided with a second compensatory donor layer formed by a binary compound or an elementary substance having a donor characteristic, and the second compensatory donor layer is used to provide compensational electrons to the first donor in the graded heterojunction.

3. The device of claim 1, wherein a thickness of the first donor layer and a thickness of the second compensatory donor layer are respectively between 1 nm and 100 μm.

4. The device of claim 2, wherein
the elementary substance is selected from the group consisting of lithium (Li), sodium (Na), calcium (Ca), magnesium (Mg), potassium (K), silicon (Si), germanium (Ge), zinc (Zn), and iron (Fe); and
the binary compound is selected from the group consisting of $Ga_xN_y$, $B_xN_y$, $Al_xN_y$, $Si_xN_y$, $B_xN_y$, $Fe_xN_y$, $Ga_xO_y$, $Al_xO_y$, $Si_xO_y$, $Zn_xO_y$, and $Fe_xO_y$, in each of chemical formulas representing the binary compound, a first element and a second element are presented from left to right, a value of x and a value of y respectively relate to a valence of the first element of the binary compound and a valence of the second element of the binary compound.

5. A semiconductor device, comprising: a substrate, a diamond layer defined on an upper surface of the substrate, a first donor layer defined on an upper surface of the diamond layer and formed by a ternary compound having a donor characteristic and graded components, a graded heterojunction formed at an interface between the diamond layer and the first donor layer, and two-dimensional electron gas formed at one side of the diamond layer adjacent to the graded heterojunction;
wherein, the two-dimensional electron gas is used as an n-type conductive channel;
wherein, the ternary compound having the donor characteristic and the graded components is selected from the group consisting of $Mg_xGa_yN_z$, $Si_xB_yN_z$, $Mg_xAl_yN_z$, $Fe_xAl_yN_z$, $Mg_xGa_yO_z$, $Fe_xAl_yO_z$, $Zn_xAl_yO_z$, $Mg_xGa_yF_z$, $Fe_xAl_yF_z$, $Zn_xAl_yF_z$, and $Zn_xMg_yF_z$, in each of chemical formulas representing the ternary compound, a first element, a second element, and a third element are represented from left to right, the first element is used to substitute a part of the second element to make a content of the first element gradually reduce and a content of the second element gradually increase, in the ternary compound, x+y=a, a represents a constant, and a value of a and a value of z respectively relate to a valence of the second element and a valence of the third element in the ternary compound.

6. The device of claim 5, wherein an upper surface of the first donor layer is provided with a second compensatory donor layer formed by a binary compound or an elementary substance having a donor characteristic, and the second compensatory donor layer is used to provide compensational electrons to the first donor in the graded heterojunction.

7. The device of claim 5, wherein a thickness of the first donor layer and a thickness of the second compensatory donor layer are respectively between 1 nm and 100 μm.

8. The device of claim 6, wherein the elementary substance is selected from the group consisting of lithium (Li), sodium (Na), calcium (Ca), magnesium (Mg), potassium (K), silicon (Si), germanium (Ge), zinc (Zn), and iron (Fe); and
the binary compound is selected from the group consisting of $Ga_xN_y$, $B_xN_y$, $Al_xN_y$, $Si_xN_y$, $B_xN_y$, $Fe_xN_y$, $Ga_xO_y$, $Al_xO_y$, $Si_xO_y$, $Zn_xO_y$, and $Fe_xO_y$, in each of chemical formulas representing the binary compound, a first element and a second element are presented from left to right, a value of x and a value of y respectively relate to a valence of the first element of the binary compound and a valence of the second element of the binary compound.

* * * * *